United States Patent [19]

Neumann

[11] 3,716,851

[45] Feb. 13, 1973

[54] SELF-SYNCHRONIZING SEQUENTIAL ENCODING SYSTEMS

[75] Inventor: Peter Gabriel Neumann, Rye, N.Y.

[73] Assignee: Bell Telephone Laboratories, Incorporated, Murray Hill, N.J.

[22] Filed: Feb. 9, 1971

[21] Appl. No.: 113,905

[52] U.S. Cl. ....340/347 DD, 340/146.1 D, 178/69.5, 179/15 BS

[51] Int. Cl. ........H04l 3/00

[58] Field of Search......340/347 DD, 146.1 D, 353, 172.5; 235/154, 153; 325/38 B; 179/15 AV, 15 BS; 178/69.5

[56] References Cited

UNITED STATES PATENTS

| | | | |
|---|---|---|---|
| 3,016,527 | 1/1962 | Gilbert et al. | 340/347 DD |
| 3,051,940 | 8/1962 | Fleckenstein | 340/347 DD |
| 3,185,823 | 5/1965 | Ellersick, Jr. et al. | 235/154 |
| 3,185,824 | 5/1965 | Blasbalg et al. | 340/347 X |

OTHER PUBLICATIONS

IBM Technical Disclosure Bulletin, by Desblache, Vol. 5, No. 8, Jan. 1963, pg. 82

*Primary Examiner*—Charles D. Miller
*Attorney*—R. J. Guenther and William L. Keefauver

[57] ABSTRACT

A number of binary variable-length sequential encoders are disclosed which produce near optimum variable-length compression codes and which have very excellent self-synchronizing properties. These self-synchronizing properties are enhanced by encoding properties called symmetry, columnization and association. In an input-output sequential encoding matrix, symmetry refers to the number of mutual reflections, complementations and rotations of a common code kernel. Columnization refers to the property of having each column of codes end in the same digit. Association refers to the property of allowing each code word to correspond to very few (possibly one) inputs.

9 Claims, 14 Drawing Figures

INVENTOR
P. G. NEUMANN
BY R. O. Nimtz
ATTORNEY

ENCODER

DECODER

| | | | | | | | | | | | | | | | | | | |
|---|---|---|---|---|---|---|---|---|---|---|---|---|---|---|---|---|---|---|
| | | | |  L=2, I=4 | | | | | | | | | | | | | | |
| FIXED LENGTH | | | | VARIABLE LENGTH | | | | | | | | | | | | | | |
| $x_1$ | $x_2$ | $x_3$ | $x_4$ | $y_1$ | $y_2$ | $y_3$ | $y_4$ | $y_5$ | $y_6$ | $y_7$ | $y_8$ | $y_9$ | $y_{10}$ | $y_{11}$ | $y_{12}$ | $y_{13}$ | $y_{14}$ | $y_{15}$ |
| 0 | 0 | 0 | 0 | 0 | | | | | | | | | | | | | | |
| 0 | 0 | 0 | 1 | 1 | 1 | | | | | | | | | | | | | |
| 0 | 0 | 1 | 0 | 1 | 0 | 0 | | | | | | | | | | | | |
| 0 | 0 | 1 | 1 | 1 | 0 | 1 | 1 | | | | | | | | | | | |
| 0 | 1 | 0 | 0 | 1 | 0 | 1 | 0 | 0 | | | | | | | | | | |
| 0 | 1 | 0 | 1 | 1 | 0 | 1 | 0 | 1 | 1 | | | | | | | | | |
| 0 | 1 | 1 | 0 | 1 | 0 | 1 | 0 | 1 | 0 | 0 | | | | | | | | |
| 0 | 1 | 1 | 1 | 1 | 0 | 1 | 0 | 1 | 0 | 1 | 1 | | | | | | | |
| 1 | 0 | 0 | 0 | 1 | 0 | 1 | 0 | 1 | 0 | 1 | 0 | 0 | | | | | | |
| 1 | 0 | 0 | 1 | 1 | 0 | 1 | 0 | 1 | 0 | 1 | 0 | 1 | 1 | | | | | |
| 1 | 0 | 1 | 0 | 1 | 0 | 1 | 0 | 1 | 0 | 1 | 0 | 1 | 0 | 0 | | | | |
| 1 | 0 | 1 | 1 | 1 | 0 | 1 | 0 | 1 | 0 | 1 | 0 | 1 | 0 | 1 | 1 | | | |
| 1 | 1 | 0 | 0 | 1 | 0 | 1 | 0 | 1 | 0 | 1 | 0 | 1 | 0 | 1 | 0 | 0 | | |
| 1 | 1 | 0 | 1 | 1 | 0 | 1 | 0 | 1 | 0 | 1 | 0 | 1 | 0 | 1 | 0 | 1 | 1 | |
| 1 | 1 | 1 | 0 | 1 | 0 | 1 | 0 | 1 | 0 | 1 | 0 | 1 | 0 | 1 | 0 | 1 | 0 | 0 |
| 1 | 1 | 1 | 1 | 1 | 0 | 1 | 0 | 1 | 0 | 1 | 0 | 1 | 0 | 1 | 0 | 1 | 0 | 1 |

MODIFICATION LOGIC

I — L=3, I=5

| x1 | x2 | x3 | x4 | y1 | y2 | y3 | y4 | y5 | y6 | y7 | y8 | y9 |
|---|---|---|---|---|---|---|---|---|---|---|---|---|
| 0 | 0 | 0 | 0 | 0 | 1 | | | | | | | |
| 0 | 0 | 0 | 1 | 1 | 0 | | | | | | | |
| 0 | 0 | 1 | 0 | 0 | 0 | 1 | | | | | | |
| 0 | 0 | 1 | 1 | 1 | 1 | 0 | | | | | | |
| 0 | 1 | 0 | 0 | 0 | 0 | 0 | 1 | | | | | |
| 0 | 1 | 0 | 1 | 1 | 1 | 1 | 0 | | | | | |
| 0 | 1 | 1 | 0 | 0 | 0 | 0 | 0 | 1 | | | | |
| 0 | 1 | 1 | 1 | 1 | 1 | 1 | 1 | 0 | | | | |
| 1 | 0 | 0 | 0 | 0 | 0 | 0 | 0 | 0 | 1 | | | |
| 1 | 0 | 0 | 1 | 1 | 1 | 1 | 1 | 1 | 0 | | | |
| 1 | 0 | 1 | 0 | 0 | 0 | 0 | 0 | 0 | 0 | 1 | | |
| 1 | 0 | 1 | 1 | 1 | 1 | 1 | 1 | 1 | 1 | 0 | | |
| 1 | 1 | 0 | 0 | 0 | 0 | 0 | 0 | 0 | 0 | 0 | 1 | |
| 1 | 1 | 0 | 1 | 1 | 1 | 1 | 1 | 1 | 1 | 1 | 0 | |
| 1 | 1 | 1 | 0 | 0 | 0 | 0 | 0 | 0 | 0 | 0 | 0 | 1 |
| 1 | 1 | 1 | 1 | 1 | 1 | 1 | 1 | 1 | 1 | 1 | 1 | 0 |

II — L=4, I=6

| x1 | x2 | x3 | x4 | y1 | y2 | y3 | y4 | y5 | y6 | y7 |
|---|---|---|---|---|---|---|---|---|---|---|
| 0 | 0 | 0 | 0 | 1 | 1 | | | | | |
| 0 | 0 | 0 | 1 | 0 | 1 | 1 | | | | |
| 0 | 0 | 1 | 0 | 1 | 0 | 0 | | | | |
| 0 | 0 | 1 | 1 | 0 | 0 | 1 | 1 | | | |
| 0 | 1 | 0 | 0 | 0 | 1 | 0 | 0 | | | |
| 0 | 1 | 0 | 1 | 1 | 0 | 1 | 1 | | | |
| 0 | 1 | 1 | 0 | 0 | 0 | 0 | 1 | 1 | | |
| 0 | 1 | 1 | 1 | 0 | 0 | 1 | 0 | 0 | | |
| 1 | 0 | 0 | 0 | 0 | 1 | 0 | 1 | 1 | | |
| 1 | 0 | 0 | 1 | 1 | 0 | 1 | 0 | 0 | | |
| 1 | 0 | 1 | 0 | 0 | 0 | 0 | 0 | 1 | 1 | |
| 1 | 0 | 1 | 1 | 0 | 0 | 0 | 1 | 0 | 0 | |
| 1 | 1 | 0 | 0 | 0 | 0 | 1 | 0 | 1 | 1 | |
| 1 | 1 | 0 | 1 | 0 | 1 | 0 | 1 | 0 | 0 | |
| 1 | 1 | 1 | 0 | 1 | 0 | 1 | 0 | 1 | 1 | |
| 1 | 1 | 1 | 1 | 0 | 0 | 0 | 0 | 0 | 1 | 1 |

III — L=8, I=8

| x1 | x2 | x3 | x4 | y1 | y2 | y3 | y4 | y5 | y6 | y7 |
|---|---|---|---|---|---|---|---|---|---|---|
| 0 | 0 | 0 | 0 | 1 | 0 | 0 | | | | |
| 0 | 0 | 0 | 1 | 1 | 1 | 0 | | | | |
| 0 | 0 | 1 | 0 | 0 | 1 | 0 | 0 | | | |
| 0 | 0 | 1 | 1 | 0 | 1 | 1 | 0 | | | |
| 0 | 1 | 0 | 0 | 0 | 0 | 1 | 0 | 0 | | |
| 0 | 1 | 0 | 1 | 0 | 0 | 1 | 1 | 0 | | |
| 0 | 1 | 1 | 0 | 1 | 0 | 1 | 0 | 0 | | |
| 0 | 1 | 1 | 1 | 1 | 0 | 1 | 1 | 0 | | |
| 1 | 0 | 0 | 0 | 0 | 0 | 0 | 1 | 0 | 0 | |
| 1 | 0 | 0 | 1 | 0 | 0 | 0 | 1 | 1 | 0 | |
| 1 | 0 | 1 | 0 | 0 | 1 | 0 | 1 | 0 | 0 | |
| 1 | 0 | 1 | 1 | 0 | 1 | 0 | 1 | 1 | 0 | |
| 1 | 1 | 0 | 0 | 0 | 0 | 0 | 0 | 1 | 0 | 0 |
| 1 | 1 | 0 | 1 | 0 | 0 | 0 | 0 | 1 | 1 | 0 |
| 1 | 1 | 1 | 0 | 0 | 0 | 1 | 0 | 1 | 0 | 0 |
| 1 | 1 | 1 | 1 | 0 | 0 | 1 | 0 | 1 | 1 | 0 |

IV — L=7, I=9

| x1 | x2 | x3 | x4 | y1 | y2 | y3 | y4 | y5 | y6 | y7 |
|---|---|---|---|---|---|---|---|---|---|---|
| 0 | 0 | 0 | 0 | 0 | 0 | 0 | | | | |
| 0 | 0 | 0 | 1 | 1 | 1 | 1 | | | | |
| 0 | 0 | 1 | 0 | 0 | 1 | 1 | 1 | | | |
| 0 | 0 | 1 | 1 | 1 | 0 | 0 | 0 | | | |
| 0 | 1 | 0 | 0 | 0 | 0 | 1 | 1 | 1 | | |
| 0 | 1 | 0 | 1 | 0 | 1 | 0 | 0 | 0 | | |
| 0 | 1 | 1 | 0 | 1 | 0 | 1 | 1 | 1 | | |
| 0 | 1 | 1 | 1 | 1 | 1 | 0 | 0 | 0 | | |
| 1 | 0 | 0 | 0 | 0 | 0 | 1 | 0 | 0 | 0 | |
| 1 | 0 | 0 | 1 | 0 | 1 | 0 | 1 | 1 | 1 | |
| 1 | 0 | 1 | 0 | 0 | 1 | 1 | 0 | 0 | 0 | |
| 1 | 0 | 1 | 1 | 1 | 0 | 0 | 1 | 1 | 1 | |
| 1 | 1 | 0 | 0 | 1 | 0 | 1 | 0 | 0 | 0 | |
| 1 | 1 | 0 | 1 | 1 | 1 | 0 | 1 | 1 | 1 | |
| 1 | 1 | 1 | 0 | 0 | 0 | 1 | 0 | 1 | 1 | 1 |
| 1 | 1 | 1 | 1 | 0 | 0 | 1 | 1 | 0 | 0 | 0 |

V — L=6, I=8

| x1 | x2 | x3 | x4 | y1 | y2 | y3 | y4 | y5 | y6 |
|---|---|---|---|---|---|---|---|---|---|
| 0 | 0 | 0 | 0 | 1 | 0 | 0 | | | |
| 0 | 0 | 0 | 1 | 0 | 1 | 0 | 0 | | |
| 0 | 0 | 1 | 0 | 1 | 1 | 0 | 0 | | |
| 0 | 0 | 1 | 1 | 1 | 0 | 1 | 1 | | |
| 0 | 1 | 0 | 0 | 0 | 0 | 1 | 0 | 0 | |
| 0 | 1 | 0 | 1 | 0 | 1 | 1 | 0 | 0 | |
| 0 | 1 | 1 | 0 | 0 | 1 | 0 | 1 | 1 | |
| 0 | 1 | 1 | 1 | 1 | 0 | 1 | 0 | 0 | |
| 1 | 0 | 0 | 0 | 1 | 1 | 0 | 1 | 1 | |
| 1 | 0 | 0 | 1 | 1 | 1 | 1 | 0 | 0 | |
| 1 | 0 | 1 | 0 | 0 | 0 | 0 | 1 | 0 | 0 |
| 1 | 0 | 1 | 1 | 0 | 0 | 1 | 1 | 0 | 0 |
| 1 | 1 | 0 | 0 | 0 | 0 | 1 | 0 | 1 | 1 |
| 1 | 1 | 0 | 1 | 0 | 1 | 0 | 1 | 0 | 0 |
| 1 | 1 | 1 | 0 | 0 | 1 | 1 | 0 | 1 | 1 |
| 1 | 1 | 1 | 1 | 0 | 1 | 1 | 1 | 0 | 0 |

VI — L=4, I=8.5

| x1 | x2 | x3 | x4 | y1 | y2 | y3 | y4 | y5 | y6 |
|---|---|---|---|---|---|---|---|---|---|
| 0 | 0 | 0 | 0 | 0 | 0 | 1 | | | |
| 0 | 0 | 0 | 1 | 0 | 1 | 0 | | | |
| 0 | 0 | 1 | 0 | 1 | 0 | 1 | | | |
| 0 | 0 | 1 | 1 | 1 | 1 | 0 | | | |
| 0 | 1 | 0 | 0 | 0 | 0 | 0 | 1 | | |
| 0 | 1 | 0 | 1 | 0 | 1 | 1 | 0 | | |
| 0 | 1 | 1 | 0 | 1 | 0 | 0 | 1 | | |
| 0 | 1 | 1 | 1 | 1 | 1 | 1 | 0 | | |
| 1 | 0 | 0 | 0 | 0 | 0 | 0 | 0 | 1 | |
| 1 | 0 | 0 | 1 | 0 | 1 | 1 | 1 | 0 | |
| 1 | 0 | 1 | 0 | 1 | 0 | 0 | 0 | 1 | |
| 1 | 0 | 1 | 1 | 1 | 1 | 1 | 1 | 0 | |
| 1 | 1 | 0 | 0 | 0 | 0 | 0 | 0 | 0 | 1 |
| 1 | 1 | 0 | 1 | 0 | 1 | 1 | 1 | 1 | 0 |
| 1 | 1 | 1 | 0 | 1 | 0 | 0 | 0 | 0 | 1 |
| 1 | 1 | 1 | 1 | 1 | 1 | 1 | 1 | 1 | 0 |

SELF-SYNCHRONIZING SEQUENTIAL ENCODING SYSTEMS

FIELD OF THE INVENTION

This invention relates to the encoding of digital information and, more particularly, to encoders and decoders for coding information in near optimum variable-length codes having self-synchronization capabilities.

BACKGROUND OF THE INVENTION

It is well known how to utilize variable-length prefix codes to minimize redundancy in digitally encoded information. Such techniques are taught by D. A. Huffman in "A Method for the Construction of Minimum Redundancy Codes," 40 *Proc. IRE* 1098, September 1952. It has been noted by the present applicant that slightly suboptimal classes of such codes (herein called "systematic codes") have self-synchronization capabilities vastly superior to the optimal (Huffman) codes. This property was noted by the present applicant in "Efficient Error-Limiting Variable-Length Codes," *IRE Trans. IT*–8, page 292, July 1962.

It is also known and has been noted by the present applicant that sequential codes using information-lossless sequential machines as encoders and decoders also have significant self-synchronization capabilities as noted in "Error-Limiting Coding Using Information-Lossless Sequential Machines," *IEEE Trans. IT*–10, page 108, April 1964. In this context a sequential code implies a code the elements of which depend upon the previous input as well as the present input. This type of historical dependency is most commonly found in simple differential codes representing the difference between the present and the preceding inputs. Such differential encodings are particularly useful for information involving large amounts of redundancy, such as, for example, video signals.

It is an object of the present invention to combine the compression capability of differential encoding with the self-synchronizing capabilities of certain sequential encodings. It is a more specific object of the invention to minimize redundancy and at the same time maximize self-synchronization in variable-length prefix encoders and decoders.

Summary of the Invention

In accordance with the present invention, variable-length sequential encoders are designed utilizing basic variable-length prefix code kernels. In the context of this disclosure, code kernels are the fundamental codes which are used as a basis for construction of other codes. The mapping of such kernel words into the sequential input-output matrix is designed to have certain properties which tend to maximize self-synchronization.

More particularly, such mapping and the corresponding encoders and decoders are designed to be symmetrical in that the total mapping comprises simple inversions and reflections of a single or a small number of code kernels. Moreover, all code words corresponding to a given input value are arranged to end in the same digit regardless of the corresponding output. This property aids in detecting the end of each code word and thus reduces the time necessary for resynchronization after errors occur. Finally, most code words are selected so as to occur only for a relatively small number of different symbols, and avoiding having each occurrence correspond to a different symbol.

When codes are designed with all of these properties, the result is a highly efficient sequential code for near optimum compression having good self-synchronization capabilities and very low encoding and decoding complexity. Because the codes are characterized by simple transformations (inversions and reflections) of the same basic code kernel, the encoders and decoders can be realized by simple logical AND and EXCLUSIVE-OR gating arrangements cascaded with traditional sequential encoders. These codes prove highly useful for redundant signaling such as video signals for television or PICTUREPHONE service.

These and other objects and features, the nature of the present invention and its various advantages, will be more readily understood from a consideration of the attached drawings and from the following description of those drawings.

DETAILED DESCRIPTION OF THE DRAWINGS

Figure 1:
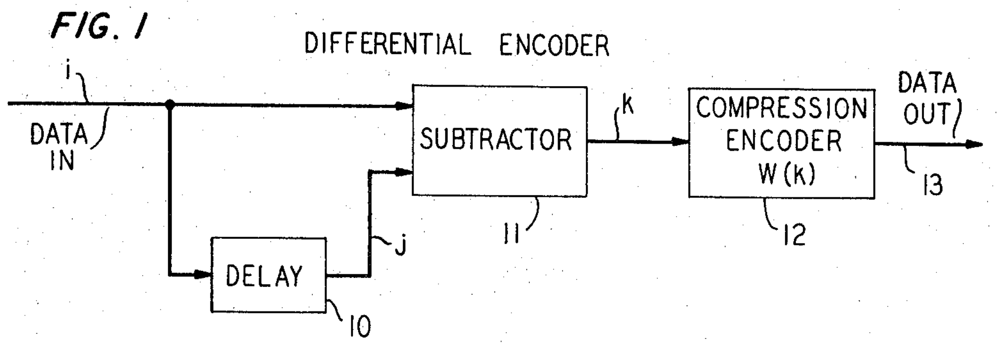
FIG. 1 is a general block diagram of a differential encoder as is well known in the prior art.

Before proceeding to a detailed description of the drawings, it may be well to review the definitions of particular terms useful in the description of the present invention.

A *code* is a collection of sequences of digits (code digits), each sequence being called a *code word*. Code *text* is obtained by concatenating code words and *encoding* is a mapping of source symbols S(*i*) onto code words W(*i*). A code is a *prefix code* if, and only if, no code word occurs as the beginning (prefix) of any other code word. Thus, in prefix code text, a code word can be decoded as soon as it is received even though there are no explicit interword markers.

A code is *exhaustive* if, and only if, every sequence of code digits is the prefix of some code text (i.e., of some sequence of code words). Thus, a uniquely decodable code must be a prefix code if it is exhaustive.

A sequence of code digits is a *synchronizing sequence* for a given code if the occurrence of the end of that sequence in (correct) code text must correspond to the end of a code word (although not necessarily to a particular code word), irrespective of what preceded that sequence.

It is known and described in the art by Schutzenberger et al. in "On An Application of Semi-Group Methods to Some Problems in Coding," *IRE Trans. IT*–2, page 47, September 1956, that most exhaustive prefix codes tend to resynchronize themselves following the loss of synchronization (e.g., after arbitrary errors, or at start-up). This resynchronization, both in the reference and in the present invention, is an intrinsic property of the code and no externally applied synchronization is required. Synchronization following an ambiguity occurs directly as the result of a synchronizing sequence which occurs naturally in the code text.

The *synchronization lag*, I, of a prefix code is defined as the average number of code digits until synchronization can be guaranteed to the end of some (not necessarily known) code word following total ambiguity. Assuming Huffman characteristic probabilities $2^{-d}$ for each code word, where *d* is the length of the code word in digits, the synchronization lag is actually the average length of the synchronizing sequences. This synchronization to the end of an unspecified code word is called first stage synchronization. Second stage synchronization takes place when the code text is synchronized to the end of a particular known code word. The *sequential synchronization lag*, J, is the average number of code digits until the end of a known code word is achieved in a known state of the code, and is equal to the average length of synchronizing sequences for sequential codes.

A *sequential encoding* is a mapping of symbols S(*i*) onto code words W(*i*|*j*) where the code word selected depends on the previously encoded symbol S(*j*) as well as the currently encoded symbol S(*i*). If the set of code words W for each *j* is a prefix code, then the set of code words is a sequential prefix code. For such codes, a synchronizing sequence is a sequence of code digits the end of which must correspond to the end of a code word (possibly unknown) resulting from a known symbol S(*i*), irrespective of what preceded that sequence. Thereafter, subsequent decoding is correct irrespective of the initial ambiguity. The present invention comprises encoders and decoders for particular classes of sequential prefix codes having a high degree of compression in their decoding and encoding and excellent self-synchronizing properties.

For a better understanding of sequential encoding, a simple example is given in Table 1.

TABLE 1

| S(*i*) | *i*=00 A | 01 B | 10 C | 11 D |
|---|---|---|---|---|
| S(*j*) | | | | |
| *j*=00 A | W(0) | W(1) | W(2) | W(3) |
| *j*=01 B | W(3) | W(0) | W(1) | W(2) |
| *j*=10 C | W(2) | W(3) | W(0) | W(1) |
| *j*=11 D | W(1) | W(2) | W(3) | W(0) |

As can be seen in Table 1, A, B, C and D represent four source symbols S(*i*), *i* = 00, 01, 10, 11, where *i* is the level of the symbol. This is an example of an encoding in which the code word W(*i*|*j*) to be transmitted is a function of the cyclic difference between the level of the symbol S(*i*) to be encoded (column headings) and the level of the symbol S(*j*) just previously encoded (row headings): W(i|j) = W(*k*), where $k = i - j$ (mod 4). This encoding is thus a difference encoding. Note that, irrespective of the choice of the code [W(*k*)], there is always ambiguity in decoding as soon as an error is made. If, for example, S(10) is decoded instead of S(01) as a result of a transmission error, subsequent decoding will consistently produce S(*i*+1) instead of S(*i*) where *i* + 1 is modulo 4, as long as further errors do not compensate for the original errors.

A differential encoder suitable for encoding in the code of Table 1 is shown in FIG. 1. This encoder comprises a delay circuit 10 which serves to delay the input symbol *i* for one symbol interval to produce a symbol *j*. Both *i* and *j* are applied to a subtractor circuit 11 which derives the difference $i - j = k$. The set of difference symbols *k* can then be encoded in a compression encoder 12 which takes advantage of whatever properties reside in the difference encodings to compress the output data train on leads 13. In a typical application, for example, encoder 12 might involve a reduced number of coding digits due to the small values of *k*. This, of course, is due to the redundancy in the input data *i* whereby the input symbols change relatively slowly and the differences *k* remain small. Preferably, however, encoder 12 is a variable-length encoder using Huffman optimal codes or near optimal variable-length codes.

Figure 2:
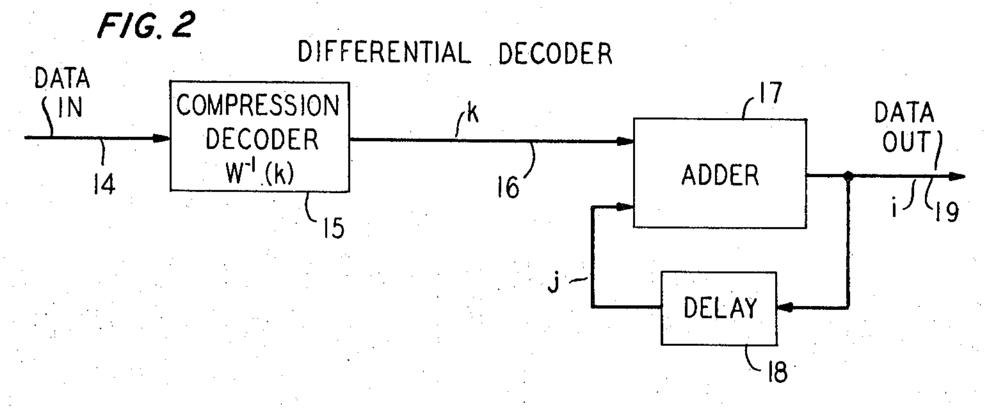
FIG. 2 is a general block diagram of a differential decoder suitable for use with the encoder of FIG. 1.

In FIG. 2 there is shown a block diagram of a decoder for the encoder of FIG. 1. The encoded data on lead 13 in FIG. 1, after being transmitted through a typical transmission medium, is delivered to compression decoder 15 by way of lead 14. Decoder 15 is the inverse of compression encoder 12 and, in the absence of error, restores the difference codes *k* on lead 16. These difference codes are applied to an adder circuit 17, the output *i* of which is applied through one symbol delay circuit 18 to the other input of adder circuit 17. Adder 17 produces on output lead 19 the sum of the *j* and *k* signals which is the information signal *i* originally applied to the encoder of FIG. 1.

Figure 3:
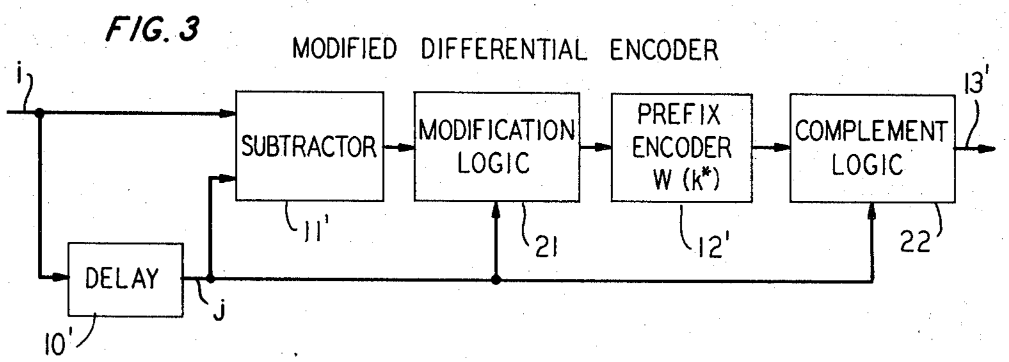
FIG. 3 is a general block diagram of a modified differential encoder in accordance with the present invention including modification and complement logic circuitry for providing self-synchronization.

In accordance with the present invention, there is shown in FIG. 3 a modification of the differential encoder shown in FIG. 1 in which a modification logic circuit 21 and a complement logic circuit 22 have been incorporated. The components corresponding to those in FIG. 1 have been identified by the same reference numerals, but with a prime. Thus, the modification logic circuit 21 is inserted in the data path between subtractor 11' and encoder 12' and is under the control of output signals from delay circuit 10'. The complement logic circuit 22 is connected between the encoder 12' and output lead 13' and is also under the control of the output of delay circuit 10'.

As will be detailed hereinafter, modification logic circuit 21 and complement logic circuit 22 are simple digital logic circuits which, when inserted as shown in FIG. 3 in a differential encoder, provide a code which is highly self-synchronizing. This self-synchronization is an intrinsic property of the code and no externally applied synchronization is required. Synchronization results directly from the naturally occurring sequences in the code text.

Figure 4:
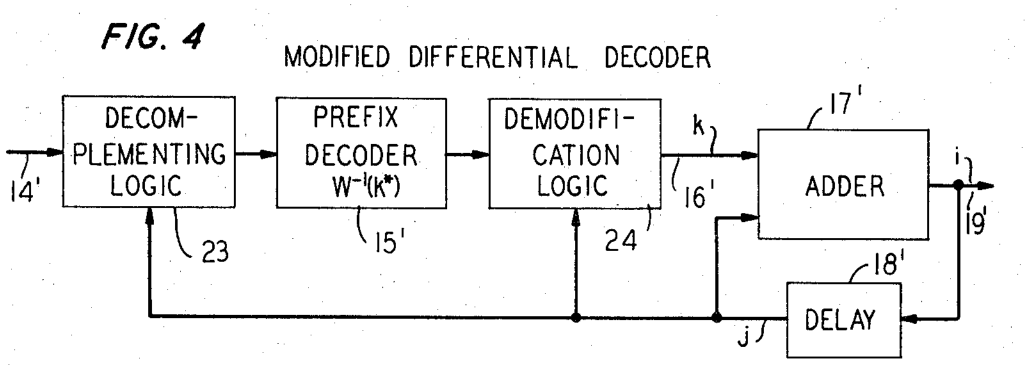
FIG. 4 is a general block diagram of a modified differential decoder suitable for use with the encoder of FIG. 3.

In FIG. 4 there is shown a modified differential decoder suitable for decoding signals derived from the encoder of FIG. 3. Again, the elements corresponding directly to the components of FIG. 2 are identified by the same reference numeral with a prime. A decomplementing logic circuit 23 is interposed between the input lead 14' and the prefix decoder 15' and is under the control of delayed output signals from delay circuit 18'. The demodification logic circuit 24 is interposed between prefix decoder 15' and one input of adder circuit 17' and is also under the control of delayed output signals from delay circuit 18'.

In accordance with the present invention, all the benefits of self-synchronization with very low synchronization lags are obtained by utilizing encoders and decoders of the forms shown in FIGS. 3 and 4, respectively. Moreover, the contents of the logic circuit of the additional logic circuits 21, 22, 23 and 24 are simple AND, OR and EXCLUSIVE-OR logical gates arranged in relatively simple arrays. These benefits flow in part from the choice and arrangement of the encoding matrix. This matrix is specifically chosen to optimize self-synchronization and at the same time insure simple, inexpensive encoding circuitry.

Figure 5:
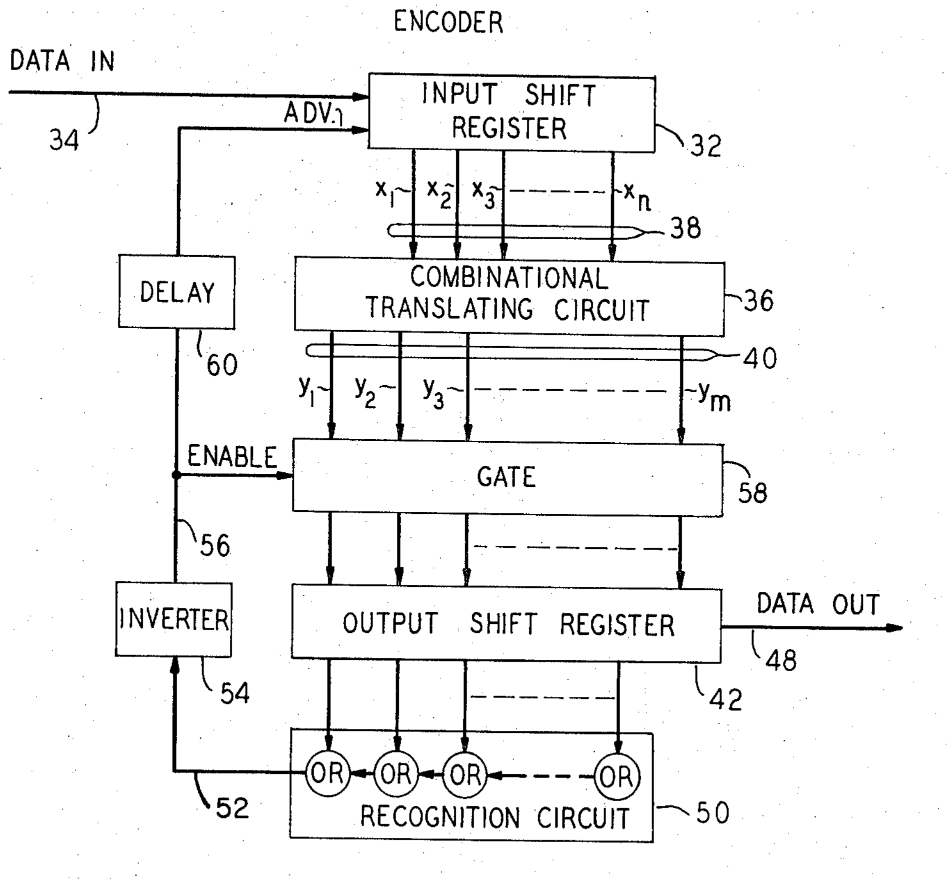
FIG. 5 is a more detailed block diagram of the prefix encoder shown as box 12′ in FIG. 3.
Figure 6:
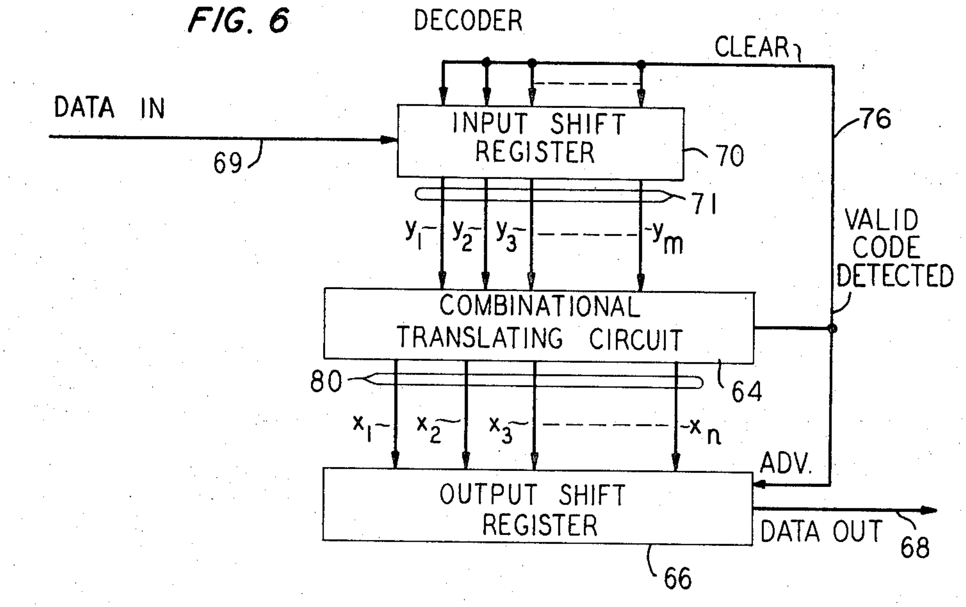
FIG. 6 is a more detailed block diagram of a prefix decoder shown as box 15′ in FIG. 4.

Before proceeding to a more detailed description of the encoders and decoders in accordance with the present invention, a brief description of one suitable type of basic sequential encoder and decoder will be taken up in connection with FIGS. 5 and 6. Thus, in FIG. 5 there is shown an input lead 34 over which fixed-length binary encoded code text arrives and is applied to input shift register 32. The input lead 34 may be an electrical transmission medium or may even be a magnetic or paper tape storage medium. These ordinary binary code words are shifted into input shift register 32, one bit at a time, until register 32 is full, and a complete code word appears on output leads 38.

Combinational translating circuit 36 converts the fixed-length binary code group appearing on leads 38 into a variable-length prefix code and applies the resultant binary signals to output leads 40. In addition, a 1 marker pulse is added to the end of each code group as it is inserted into output shift register 42. This marker bit is used to control the local encoding circuitry and is not transmitted to the receiver. This 1 signal is inserted immediately following the code word and acts as a suffix marker to indicate the end of the variable-length code word.

The recognition circuit 50 detects the presence of a 1 in any but the rightmost position of the output shift register 42. Thus, recognition circuit 50 will produce an output on lead 52 until the marker pulse arrives in the last storage position of shift register 42. When the marker pulse reaches the last stage of shift register 42, the variable-length code group has been completely transmitted on output lead 48. At this time all signals disappear from output lead 52 and this absence of a signal, after inversion in inverter circuit 54, provides an active signal to enable gate 58 and store the next variable-length code group in output register 42. The new codes write over the contents of register 42, destroying the previous marker signal. The output of inverter circuit 54 is also applied to delay circuit 60, the output of which is used to advance the next input code group into input shift register 32.

The encoder of FIG. 5 is thus seen to comprise a generalized fixed-length to variable-length translator suitable for converting fixed-length input signals, possibly representing differential codes, into variable-length codes which may have minimum redundancy properties. It will be noted that the 1 marker signals never leave output shift register 42 and are merely used to mark the end of the variable-length codes within register 42.

In FIG. 6 there is shown a decoder which performs the inverse operation to that shown by the encoder of FIG. 5. In FIG. 6 variable-length encoded signals arriving on input lead 69 are applied to input shift register 70. Output leads 71 from input shift register 70 are applied to combinational translating circuit 64 where they are converted into a fixed-length code group 80 and stored in shift register 66. Fixed-length code groups from output shift register 66 are transmitted on output line 68.

Each time a valid code group is detected by combinational translating circuit 64, a "valid-code " signal is transmitted on control lead 76 to clear the stages of input shift register 70. This same valid-code signal initiates the application of advance pulses to output shift register 66 to shift this new code onto transmission line 68.

Translating circuits 36 and 64 in FIGS. 5 and 6, respectively, each comprise a combination of logic gating circuits which are driven by the input signals and, when thus enabled, provide binary signals on the corresponding output leads. In the case of translating circuit 36, in addition to the usual variable-length code group, there is also produced the marker pulse to terminate each group. Such marker pulses are not required in the translating circuit 64. A valid-code detecting circuit may be provided which may comprise, for example, a multi-input OR gate, each input of which corresponds to one valid code.

Other forms of variable-length encoders and decoders may be utilized in the transmission systems of the present invention. Those shown in FIGS. 5 and 6 are merely illustrative and are in no way to be taken as limiting examples. One example of such circuits is shown in E. N. Gilbert et al. U.S. Pat. No. 3,016,527, granted Jan. 9, 1962.

A specific example of encoding schemes of the type shown generically in FIGS. 3 and 4 may be useful. For the purposes of this illustration, a simple two-digit system has been selected as shown in the following Table 2:

TABLE 2

| S(*i*) | *i*=00 | 01 | 10 | 11 |
|---|---|---|---|---|
| S(*j*) *pq* | A | B | C | D |
| *j*=00 A | 0 | 11 | 100 | 101 |
| *j*=01 B | 010 | 1 | 00 | 011 |
| *j*=10 C | 100 | 11 | 0 | 101 |
| *j*=11 D | 010 | 011 | 00 | 1 |

In this example, four different prefix encodings are used, one for each value of *j*. The particular encoding used depends upon the value of *i* which follows any particular value of *j*.

It can easily be shown that the sequence 0011 is a synchronizing sequence ending in a value of *i* equal to 01. Thus, the sequence 0011 synchronizes the decoder to the end of a particular code word irrespective of what preceded the synchronizing sequence. In a similar fashion, the sequence 00101 synchronizes the decoder to *i*= 11; the sequence 1100 synchronizes to *i*= 10; and the sequence 11010 synchronizes to *i* = 00. Assuming that the code words appear with Huffman probabilities, it is easily shown that synchronization results from total ambiguity after an average of only 7.67 binary digits (J = 7.67). This sequential synchronization lag J, as noted above, is the average number of code bits until the end of a code word is achieved which corresponds to a known symbol. In other words, J is the average length of all of the synchronizing sequences.

The choice of the code of Table 2 is highly superior to that of Table 1 in terms of self-synchronization. Using the same sequence (0,11,100,101), the encoding of Table 1 has no self-synchronizing capabilities. The encoding of Table 2, on the other hand, has extremely tight self-synchronization, guaranteeing that synchronization errors persist, on the average, for only about eight bits. These two codes, however, are identical with respect to their compression capabilities, i.e., their ability to compact the input data by probability encoding.

A close examination of the encoding of Table 2 indicates that the code for the line B is the binary complement of the code for line A, but cyclically shifted by one word. The code for line C is a mirror reflection of the code A, shifted two words. Finally, the code for line D is the cyclic shift of the complement (or the complement of the shift) of the code for line A. Thus, all of the codes in Table 2 are closely related to any one of them. This property produces distinct encoding and decoding advantages which will be gone into in greater detail hereinafter.

Figure 7:
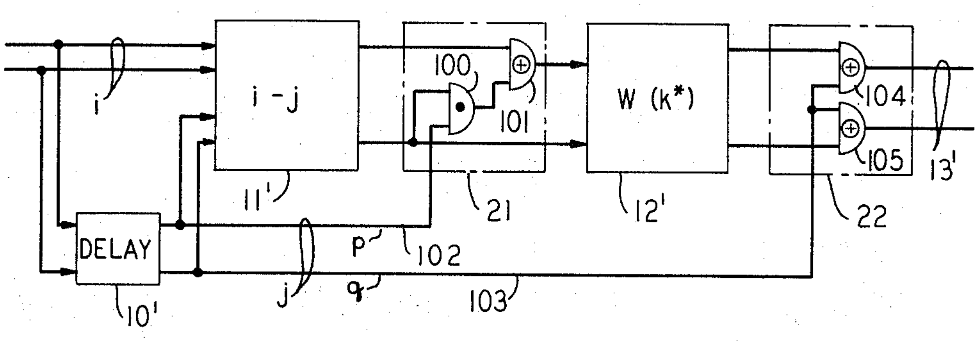
FIG. 7 is a detailed block diagram of a simple two-digit encoder of the type illustrated in general form in FIG. 3.

In FIG. 7 there is shown a block diagram of an encoder suitable for encoding signals as shown in Table 2. As can be seen by inspection of Table 2, if the first digit (*p*) of *j* is a 1, then the reflected code is utilized. This is accomplished in FIG. 7 by the AND gate 100 and the EXCLUSIVE-OR gate 101. In FIG. 7 the elements corresponding to those shown in FIG. 3 are identified by the same reference numerals. Thus, the output *p* from delay circuit 10', appearing on lead 102, is applied to one input of AND gate 100. The other input to AND gate 100 is taken from one output of subtractor circuit 11'. The output of AND gate 100 is applied to one input of EXCLUSIVE-OR gate 101. The remaining output of subtractor circuit 11' is supplied to the remaining input of EXCLUSIVE-OR gate 101. Gates 100 and 101 together comprise the modification logic circuit 21 which serves to produce reflected codes from the normal difference code supplied by subtractor circuit 11'. These modified codes are supplied to the prefix encoder 12' which may have the form shown in FIG. 5. The gates shown in FIG. 7 may be implemented by any known circuit arrangement such as appropriate integrated semiconductor circuit arrays.

Inspection of the codes of Table 2 indicates that if the second digit (*q*) is a 1, the code group is complemented from the normal code grouping. In FIG. 7, the *q* output on lead 103 is therefore supplied to EXCLUSIVE-OR gates 104 and 105, which, when thus enabled, complement the output from encoder 12' for delivery to output leads 13'.

It can thus be seen that a basic differential encoder, such as that shown in FIG. 1, can be modified to have extremely good self-synchronizing capabilities by the mere addition of simple logic circuits 21 and 22. These logic circuits represent very small marginal costs in the overall encoder and yet provide very significant synchronizing advantages.

Figure 8:
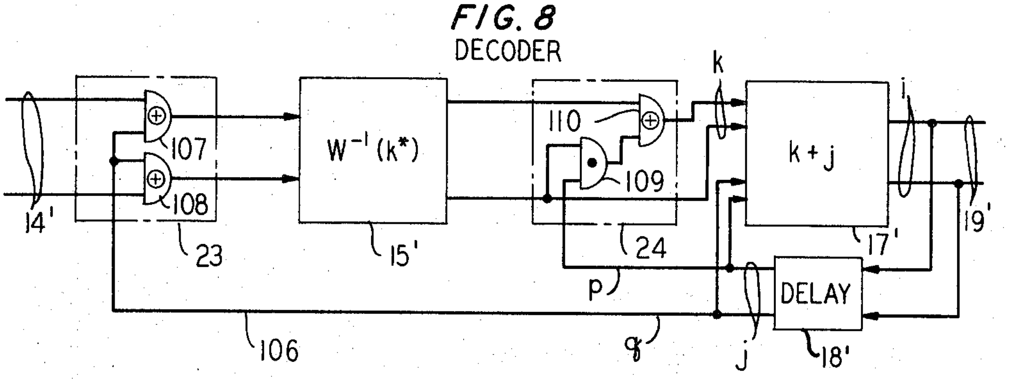
FIG. 8 is a more detailed block diagram of a simple two-digit decoder such as that shown in general form in FIG. 4.

In FIG. 8, there is shown a block diagram of a decoding circuit suitable for decoding codes such as those shown in Table 2. Elements corresponding to those shown in FIG. 4 have been identified by the same reference numeral. The *q* output from delay circuit 18' is applied by lead 106 to EXCLUSIVE-OR circuits 107 and 108 to complement input codes when the value of *q* is 1. The p output of delay circuit 18' is applied to AND gate 109, the output of which is applied to EXCLUSIVE-OR gate 110. Gates 109 and 110 together comprise modification logic circuit 24 and serve to obtain the reflection of the output of encoder 15' for delivery to adder circuit 17'. Again, the marginal cost of the self-synchronizing capabilities are represented by the logic circuits 23 and 24, which are a small portion of the overall decoder circuit.

It can be seen from the code of Table 2 and the corresponding circuitry of FIGS. 7 and 8, that the sequential codes should have considerable structure in order to simplify the encoding and decoding processes and also to facilitate the construction of large encodings. As a result of extensive investigation, it has been discovered that the following properties are of considerable importance in obtaining the desired structures.

In the first place, in order to simplify the encoding and decoding properties, the number of distinct prefix code kernels which form distinct nonderived code sets should be very small, one or two at the most. This is true because a separate independent encoder and decoder are usually required for each independent code kernel. The property of keeping the number of code kernels small has been called the *symmetrization* property, since it results in encoding matrices comprising a small number of code kernels and various complements, rotations and reflections of those basic kernels.

It will be noted in the encoding of Table 2 that all code words for a given value of *i* end in the same digit irrespective of the value of *j*. This property, which has been called the *columnization* property, greatly enhances self-synchronization by providing uniform endings for the values of i.

A third property of the encoding of Table 2 has been called the *association* property and involves the number of different symbols with which a given code word corresponds. The association property calls for maintaining this number of different symbols to which a given code word can correspond as small as possible and yet avoiding having each occurrence correspond to a different symbol S($i$). The association property greatly enhances second stage synchronization.

An example of a two-kernel code which satisfies the columnization and association properties and which has a sequential synchronization lag J equal to 8.9 is shown in Table 3.

TABLE 3

| S($j$) | S($i$)=A | B | C | D | E |
|---|---|---|---|---|---|
| A | 0 | 11 | 100 | 1011 | 1010 |
| B | 010 | 1 | 00 | 0111 | 0110 |
| C | 1010 | 11 | 0 | 1011 | 100 |
| D | 010 | 0111 | 00 | 1 | 0110 |
| E | 1010 | 11 | 100 | 1011 | 0 |

Some properties of the code of Table 3 in their consequences will be discussed. In a columnized code such as that shown in Table 3, a set of symbols S($i$) for which all code words end in 0 is called the 0-set and the set of symbols S($i$) for which all code words end in 1 is called the 1-set. In the example of Table 3, the sequence 00 (among others) guarantees the end of a code word corresponding to the 0-set A, C or E, $i$ being an even value. Similarly, the sequence 111 guarantees the end of a code word corresponding to the 1-set B or D, with $i$ being odd. Once the ambiguity has been reduced to a 0-set symbol or a 1-set symbol, the association property within these sets is of great assistance in reaching second stage synchronization. The association property is especially helpful to second stage synchronization if the prefix code is the same for each symbol S($j$) in the 0-set and similarly, for the 1-set. This special association property of columnized codes is called the *bifurcation* property. By definition, bifurcated codes must be columnized.

If the columnization property is to be achieved in a complemented sequential code, then any kernel prefix code and its complement must each have the same number of code words ending in zero and the same number ending in one. Consequently, the prefix code and its complement must have one-half of its code words ending in each digit. Such a prefix code is called a *balanced* code and of course, must have an even number of code words. The code of Table 2 is an example of a balanced prefix code using a complemented one-kernel code. It can be shown that for every set of code-word lengths with $n$ even and for which there exists an exhaustive prefix code, there also exists at least one balanced prefix code.

One example of an encoding having all the desirable properties described above and which can be extended into very large code sets is illustrated in Table 4.

TABLE 4

INPUT-OUTPUT MATRIX FOR A SYMMETRICAL, COLUMNIZED, BIFURCATED, BALANCED CODE HAVING ANY ARBITRARY PREFIX CODE KERNEL W($k$)

| $J_{even}$ | $i$=0 | $i$=1 | $i$=2 | $i$=$n$-3 | $i$=$n$-2 | $i$=$n$-1 | $j_{odd}$ |
|---|---|---|---|---|---|---|---|
| $j$=0 | W(0) | W(1) | W(2) | W($n$-3) | W($n$-2) | W($n$-1) | $n$-1 |
| 2 | W(2) | W(1) | W(0) | W($n$-3) | W($n$-2) | W($n$-1) | $n$-3 |
| 4 | W(4) | W(1) | W(2) | W($n$-3) | W($n$-2) | W($n$-1) | $n$-5 |
| 6 | W(6) | W(1) | W(2) | W($n$-3) | W($n$-2) | W($n$-1) | $n$-7 |
| $n$-8 | W ($n$-8) | W(1) | W(2) | W($n$-3) | W($n$-2) | W($n$-1) | 7 |
| $n$-6 | W ($n$-6) | W(1) | W(2) | W($n$-3) | W($n$-2) | W($n$-1) | 5 |
| $n$-4 | W ($n$-4) | W(1) | W(2) | W($n$-3) | W($n$-2) | W($n$-1) | 3 |
| $n$-2 | w ($n$-2 | W(1) | W(2) | W($n$-3) | W(0) | W($n$-1) | $j$=1 |

The code of Table 4 is columnized, complemented, bifurcated and maximally associated without being trivial. It assumes a very high probability that $i = j$ for compression purposes. It will be noted that if $j$ is odd, the complementary code word is used and Table 4 is read from the bottom up. The code set therefore has complementary reflective symmetry.

The pattern of Table 4 can be seen to consist of the following: For each even value of j other than the zero, the value of the kernel code W($k$) is that for $k = 0$ when $i = j$. For $i = 0$, value $k = j$, and $k = i$ at all other times. The code words for odd values of j are specified by the complementary reflective symmetry.

Although Huffman optimal prefix codes may be used directly as code kernels, synchronization is greatly improved if truncated systematic prefix codes are used. A systematic code is a code in which successive code words are generated in accordance with a fixed rule or algorithm, and thus have systematic properties. In this way the first stage synchronization lag can be kept small even though the size of the code words increases. One such truncated systematic prefix code which is suitable for use as the kernel for the encoding scheme of Table 4 is shown in FIG. 11.

Figure 11:
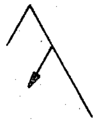
FIG. 11 is a table showing the code equivalents between fixed-length binary code symbols and the variable-length code groups of one particular prefix code having superior synchronizing abilities.

In FIG. 11 the fixed-length code groups $x_1$, $x_2$, $x_3$, $x_4$ correspond to the values of $k$ while the $y_1$ through $y_{15}$ correspond to the bits of the variable-length code groups. The average code word length L, assuming each word occurs with its characteristic Huffman probability, is 2. The synchronization lag I is equal to 4.

At the top of FIG. 11 is a graphical representation in the form of a binary tree of the code generation algorithm. A 0 code digit corresponds to a left-downward motion while a 1 code digit corresponds to a right-downward motion. A terminal node without an arrow indicates the end of a code word. A terminal node with an arrow indicates a transition to another node on the diagram. If the arrow does not explicitly point to the reentry node, the reentry node is assumed to be at the top or root of the diagram. The code set is generated by starting at the top or root and proceeding to a terminal node without an arrow. Different word lengths are obtained by utilizing the reentrant arrows exhaustively in all possible combinations.

It will be noted that the code of FIG. 11 includes only one code group for each length and hence is most useful for a signal having a corresponding geometric probability distribution. Moreover, the particular code kernel of FIG. 11 represents a class of codes in which the differential circuitry is not necessary. Due to the code construction, it is easier to encode directly from the input code groups $i$ and, in effect, combine the difference circuitry with the modification logic. An encoder using this overall structural arrangement is shown in FIG. 9.

Figure 9:
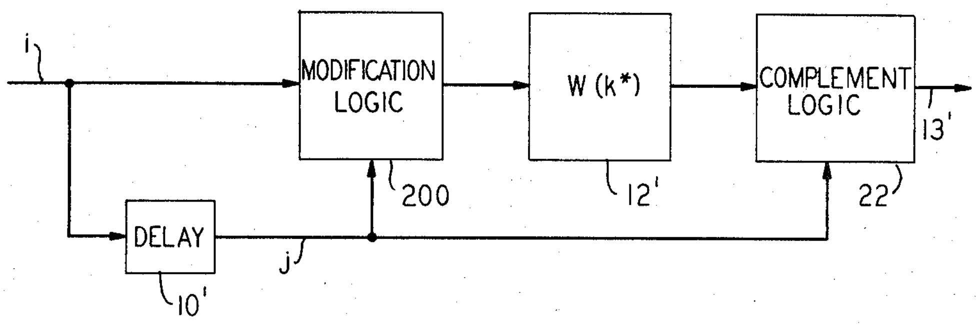
FIG. 9 is a general block diagram of an encoding circuit in which the subtraction circuitry has been incorporated in the modification logic.

The encoder in FIG. 9 corresponds to that shown in FIG. 3 except that the modification logic circuit 200 is not preceded by a subtractor similar to subtractor 11' in FIG. 3. These codes therefore have the added advantage of still further simplifying the encoder and decoder and yet obtaining extremely good self-synchronization.

Figure 10:
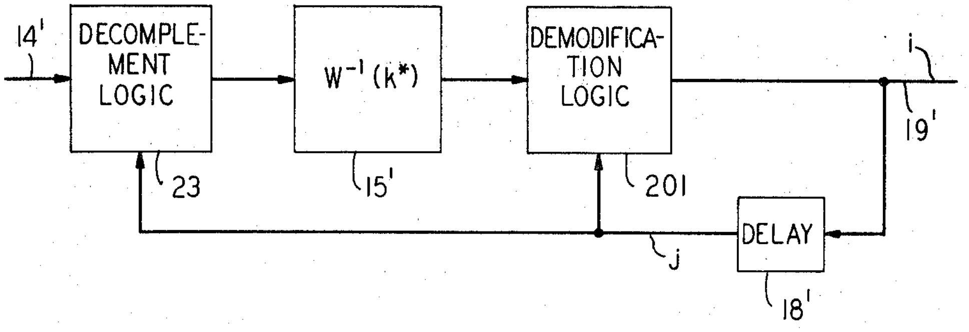
FIG. 10 is a general block diagram of a decoder of the type shown in FIG. 4 in which the adder circuit has been incorporated in the modification logic.

In FIG. 10 there is shown a corresponding decoder circuit in which the adder function has been incorporated in the demodification logic 201 and no adder corresponding to adder 17′ in FIG. 4 is required.

Figure 12:
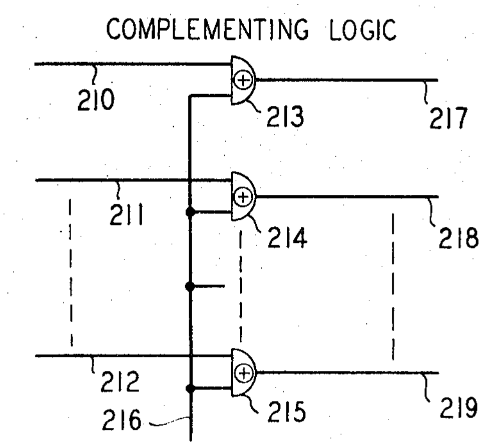
FIG. 12 is a detailed circuit diagram of the complementing logic useful in the circuits of FIG. 3, 4, 9 and 10.

The complementing and decomplementing logic of FIGS. 9 and 10 can be most easily realized by a circuit similar to that shown in FIG. 12. A plurality of input bits to be complemented are applied to input leads 210, 211 . . . 212. Each of input leads 210, 211 . . . 212 is applied to a corresponding one of EXCLUSIVE-OR gates 213, 214 . . . 215. The remaining input for all of these EXCLUSIVE-OR gates is taken from control lead 216. The outputs appearing on output leads 217, 218 . . . 219 are the complements of the input signals if, and only if, gates 213 through 215 are energized by a signal on lead 216. Otherwise these outputs on leads 217 through 219 are identical to the input signals on leads 210 through 212.

Figure 13:
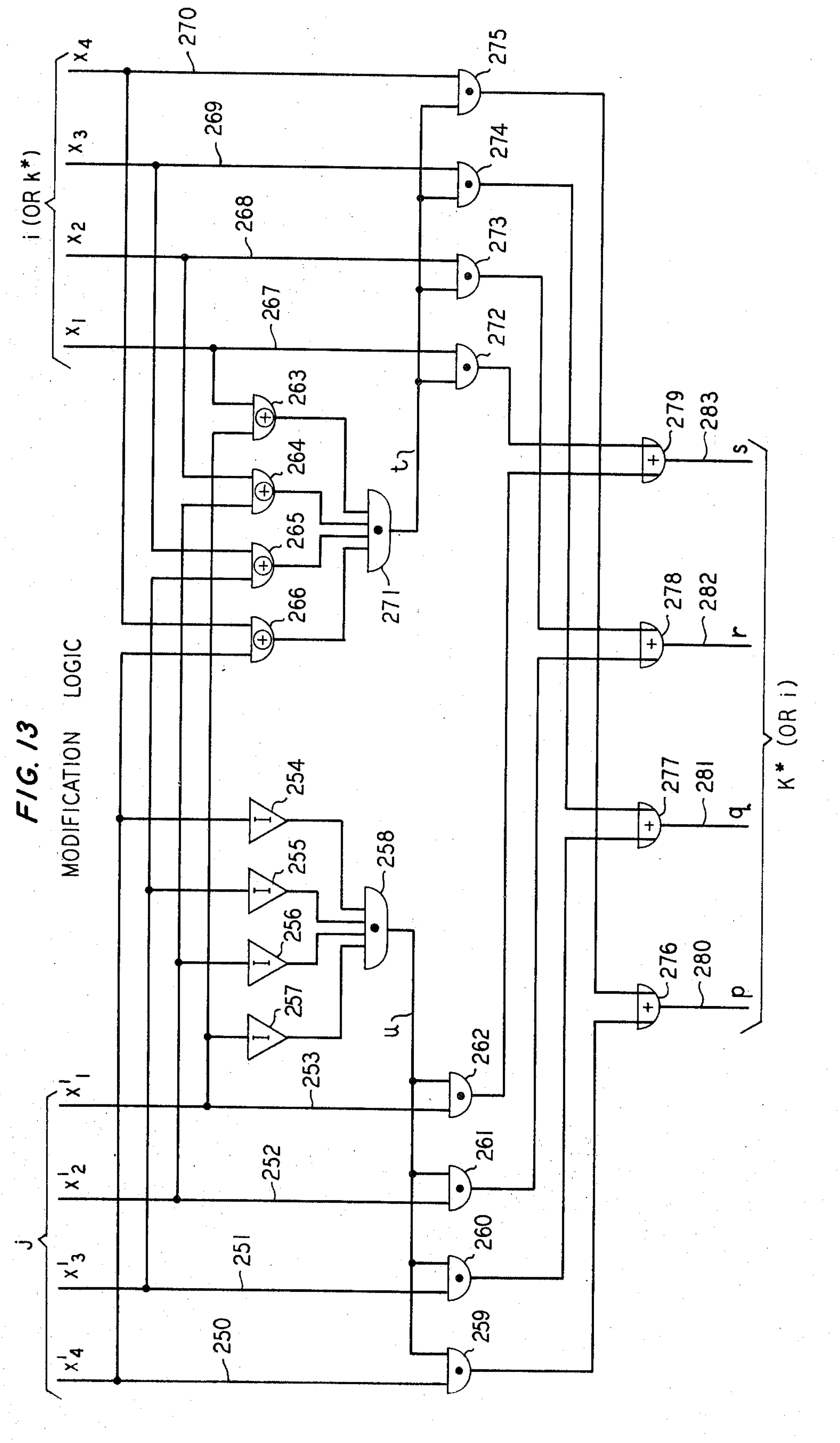
FIG. 13 is a detailed circuit diagram of the combined modification logic and subtraction logic for the encoder of FIG. 9 utilizing the prefix code of FIG. 11.

In FIG. 13 there is shown the modification logic suitable as modification logic 200 in FIG. 9 and equally suitable (by interchanging input and output) as demodification logic 201 in FIG. 10 for the code illustrated in FIG. 11. In accordance with the description of Table 4, if $j$ is even, the following relationships prevail:

$$k=j \text{ for } i=0,$$

$$k=0 \text{ for } i=j, \text{ and}$$

$$k=i \text{ otherwise.}$$

If $j$ is odd, then $$k=15-j \text{ for } i=15,$$

$$k=0 \text{ for } i=j, \text{ and}$$

$$k=15-i \text{ otherwise.}$$

Let $i$ and $j$ be binary numbers, $i$ being represented by $(x_1, x_2, x_3, x_4)$ and $j$ by $(x_1', x_2', x_3', x_4')$. Using this notation, a bar over a binary digit denotes binary complementation. Thus $\bar{i}=15-i=(\bar{x}_1, \bar{x}_2, \bar{x}_3, \bar{x}_4)$.

Let $u$ equal 1 if, and only if, $$x_1=x_2=x_3=x_4=0 .$$

That is, $u=\bar{x}_1 \cdot \bar{x}_2 \cdot \bar{x}_3 \cdot \bar{x}_4$ (a Boolean product). Further, let $t=1$ if, and only if, $i=j$. That is, $$t=(x_1+x_1') \cdot (x_2+x_2') \cdot (x_3+x_3') \cdot (x_4+x_4') .$$

Thus, $t$ is the Boolean product of four modulo two (EXCLUSIVE-OR) sums. Then, if $k$ is represented by the four-bit binary number $k=(p,q,r,s)$, it follows that $$p=t \cdot x_1+u \cdot x_1'$$

$$q=t \cdot x_2+u \cdot x_2'$$

$$r=t \cdot x_3+u \cdot x_3'$$

$$s=t \cdot x_4+u \cdot x_4'.$$

Turning then to FIG. 13, the value $u$ is obtained from $j$ by connecting each of lines 250, 251, 252 and 253 to a corresponding one of inverters 254 through 257. The outputs of these inverters are applied to AND gate 258, the output of which comprises the binary value $u$. The signal $u$ is applied to one input of each AND gates 259, 260, 261 and 262, the other input of which is taken from lines 250 through 253.

The binary value $t$ is derived by connecting each of input lines 250 through 253 to a corresponding one input of EXCLUSIVE-OR gates 263 through 266, respectively. The other inputs to EXCLUSIVE-OR gates 263 through 266 are taken from leads 267 through 270, corresponding, respectively, to the input values $x_1$, $x_2$, $x_3$ and $x_4$. The outputs of EXCLUSIVE-OR gates 263 through 266 are all applied to AND gate 271. AND gate 271, when enabled enables AND gates 272, 273,274 and 275, the other inputs of which correspond respectively to $x_1$, $x_2$, $x_3$, $x_4$ on leads 267 through 270.

The outputs of AND gates 259 through 262 are applied to respective one inputs of OR gates 276 through 279. The outputs of gates 272 through 275 are applied to the remaining inputs of OR gates 276 through 279, appearing on output leads 280 to 283. These outputs comprise the binary values $p$, $q$, $r$ and $s$ and, in the encoder of FIG. 9, can be applied directly to a prefix encoder 12′.

The logic of FIG. 13 can be used directly as the demodification logic 201 in FIG. 10 simply by applying the values of $k^*$ to input leads 267 to 270. The outputs of OR gates 280 through 283 then comprise the binary number $i$.

The complementing logic of FIG. 12, when used in the encoder of FIG. 9 for the codes of Table 4, is under the control of the bit $x_4'$, indicating whether or not $j$ is odd. A signal representing the value of $x_4'$, then, would be applied to control lead 216 in FIG. 12.

Figure 14:
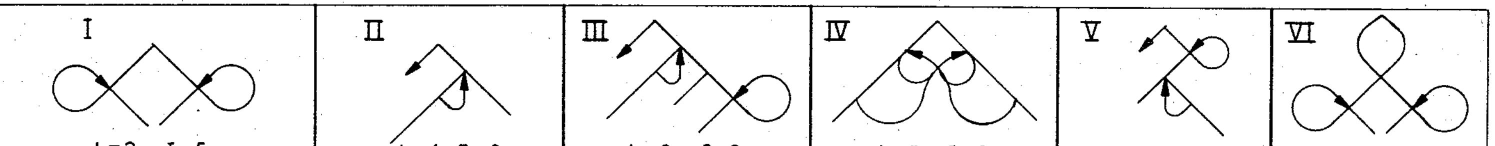
FIG. 14 is a table of alternative variable-length prefix codes which might also be used to realize encoders and decoders of the general form shown in FIGS. 3 and 4, respectively.

Although the kernel code shown in FIG. 11 has some advantages in the encoder of FIG. 9, it is by no means the only code set which can be used. In FIG. 14 there are disclosed six other kernel codes identified by the columns I – VI. Each of these codes has somewhat different length distributions and synchronization lags. Each can be used as the kernel code in the encoding scheme illustrated in Table 4. Other coding kernels and other encoding schemes may also be used to obtain self-synchronization and examples herein given merely illustrate the desirable encoding properties. Some other codes can be found in "Efficient Error-Limiting Variable-Length Codes," by the present inventor, referred to earlier herein.

The first step in selecting a sequential encoding is to establish the optimal code word length for each value $j$ based on the conditional probabilities of S($i$), given S($j$). This may be done by using the Huffman algorithm as described in "A Method for the Construction of Minimum Redundancy Codes," *Proceedings of the IRE*, Vol. 40, pages 1098 through 1101, September 1952. Inspection of the matrix of lengths thus obtained indicates the symmetries that the code should have and whether or not a reflective symmetry is needed, and whether the code can be a one-kernel code. The next step is to choose the kernel code having the lengths corresponding most closely to the desired lengths. The encodings are then arranged to optimize the columnization and association properties. The best self-synchronizing code, of course, corresponds to that having desirable symmetries, columnization and association.

What is claimed is:

1. A code converter for variable-length sequential self-synchronized codes comprising a kernel encoder for encoding fixed-length input signals into variable-length kernel coded signals, modification logic, responsive to delayed input signals, for modifying selected values of said input signals to form reflections thereof, and complement logic, responsive to said delayed input signals, for complementing selected ones of said variable-length kernel coded signals.

2. The code converter according to claim 1 wherein said kernel encoder comprises a Huffman optimum encoder.

3. The code converter according to claim 1 wherein said kernel encoder comprises a systematic truncated prefix code generator.

4. The code converter according to claim 1 wherein said modification logic includes logical OR gates driving EXCLUSIVE-AND gates and under the control of said delayed input signals.

5. The code converter according to claim 1 wherein said complement logic includes a plurality of EXCLUSIVE-OR gates all under the control of one common input from said delayed input signals.

6. A self-synchronized digital transmission system comprising a first transmission medium carrying fixed-length digital code words, a second transmission medium carrying self-synchronizing variable-length digital code words, and a sequential translation circuit interconnecting said first and second transmission media and including means for providing symmetrization, means for providing columnization and means for providing associative properties encoding between said fixed-length and said variable-length code words.

7. The self-synchronized digital transmission system according to claim 6 wherein said sequential translation circuit includes symmetrizing means for providing a plurality of reflections, complements and rotations of a single kernel code.

8. The self-synchronizing digital transmission system according to claim 6 wherein said sequential translation circuit includes columnizing means for providing a different variable-length code word for a given fixed-length code word depending on the preceding fixed-length code word, all said variable-length code words ending in the same binary digit value.

9. The self-synchronizing digital transmission system according to claim 6 wherein said sequential translation circuit includes associatizing means for providing variable-length code words each corresponding to only a few fixed-length code words.

* * * * *